(12) United States Patent
Nandwana et al.

(10) Patent No.: US 11,863,222 B2
(45) Date of Patent: Jan. 2, 2024

(54) LOW AREA EQUALIZER WITH LANE MISMATCH ADAPTATION FOR SUB-RATE RECEIVERS

(71) Applicant: Cisco Technology, Inc., San Jose, CA (US)

(72) Inventors: Romesh Kumar Nandwana, Breinigsville, PA (US); Abhishek Bhat, Allentown, PA (US); Kadaba Lakshmikumar, Basking Ridge, NJ (US); Pavan Kumar Hanumolu, Champaign, IL (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 77 days.

(21) Appl. No.: 17/528,413

(22) Filed: Nov. 17, 2021

(65) Prior Publication Data

US 2023/0155618 A1    May 18, 2023

(51) Int. Cl.
*H04B 1/16*    (2006.01)
*H03M 1/66*    (2006.01)

(52) U.S. Cl.
CPC ................ *H04B 1/16* (2013.01); *H03M 1/66* (2013.01)

(58) Field of Classification Search
CPC .................................. H04B 1/16; H03M 1/66
See application file for complete search history.

(56) References Cited

U.S. PATENT DOCUMENTS

| 8,958,512 B1 | 2/2015 | Ding et al. |
| 10,461,764 B1 | 10/2019 | Paro Filho et al. |
| 11,539,371 B1* | 12/2022 | Tang .................... H03M 1/1014 |
| 2010/0046683 A1 | 2/2010 | Beukema et al. |
| 2010/0266006 A1 | 10/2010 | Werner et al. |
| 2012/0249348 A1* | 10/2012 | Siragusa ............. H03M 1/1009 341/110 |
| 2013/0135127 A1* | 5/2013 | Siragusa ............. H03M 1/1033 341/110 |

(Continued)

OTHER PUBLICATIONS

Jaeduk Han, et al., "Design Techniques for a 60-GB/s 288-mW NRZ Transceiver With Adaptive Equalization and Baud-Rate Clock and Data Recovery in 65-nm CMOS Technology," IEEE Journal of Solid-State Circuits, vol. 52, No. 12, Dec. 2017, 12 pages.

*Primary Examiner* — Jean B Corrielus
(74) *Attorney, Agent, or Firm* — Edell, Shapiro & Finnan, LLC

(57) ABSTRACT

A receiver is provided that includes a plurality of sub-rate receiver lanes each of which is configured to receive an analog receive signal from an analog front-end and produce digital sub-rate receiver data. The receiver includes one or more first digital-to-analog converters (DACs) (also referred to herein as "average" DACs) shared across the plurality of sub-rate receiver lanes, and one or more second DACs (also referred to herein as "mismatch cancellation" DACs) for each sub-rate receiver lane of the plurality of sub-rate receiver lanes. The one or more second DACs of a respective sub-rate receiver lane provide output to be combined with an output of a corresponding one of the one or more first DACs during processing of the analog receive signal in the respective sub-rate receiver lane to account for a sub-rate receiver lane specific offset with respect to a corresponding one of the one or more first DACs.

20 Claims, 10 Drawing Sheets

(56) References Cited

U.S. PATENT DOCUMENTS

| | | |
|---|---|---|
| 2018/0219620 A1 | 8/2018 | Fludger et al. |
| 2019/0052293 A1* | 2/2019 | Giraldo .................. H03M 1/08 |
| 2022/0345141 A1* | 10/2022 | Ho .......................... H04B 3/23 |

* cited by examiner

LOW AREA EQUALIZER WITH LANE MISMATCH ADAPTATION FOR SUB-RATE RECEIVERS

TECHNICAL FIELD

The present disclosure relates to receiver circuitry, such as used in high-speed optical and electrical receivers.

BACKGROUND

As data rates for optical and electrical transceivers continue to increase, the data bit period and timing margin are shrinking. For example, for a 106.25 Gigabits per second (Gbps)/λ. Pulse Amplitude Modulation-4 (PAM-4) modulation scheme, the signal bit period is only 18.82 picoseconds (ps). With higher data rates and low timing margins, the clocking circuit and receiver timing requirements are becoming increasingly challenging.

To relax timing requirements, sub-rate receiver architectures are being used, such as half-rate or quarter-rate receiver architectures. Nevertheless, with a 200 Gbps/λ, signal, the timing requirements will become even more stringent and would involve quarter-rate or ⅛th rate receivers in the future. Random and systematic mismatch between sub-rate lanes impact the signal-to-noise ratio (SNR) of different lanes and can result in suboptimal SNR in the receiver.

DESCRIPTION OF EXAMPLE EMBODIMENTS

Overview

Figure 1A:
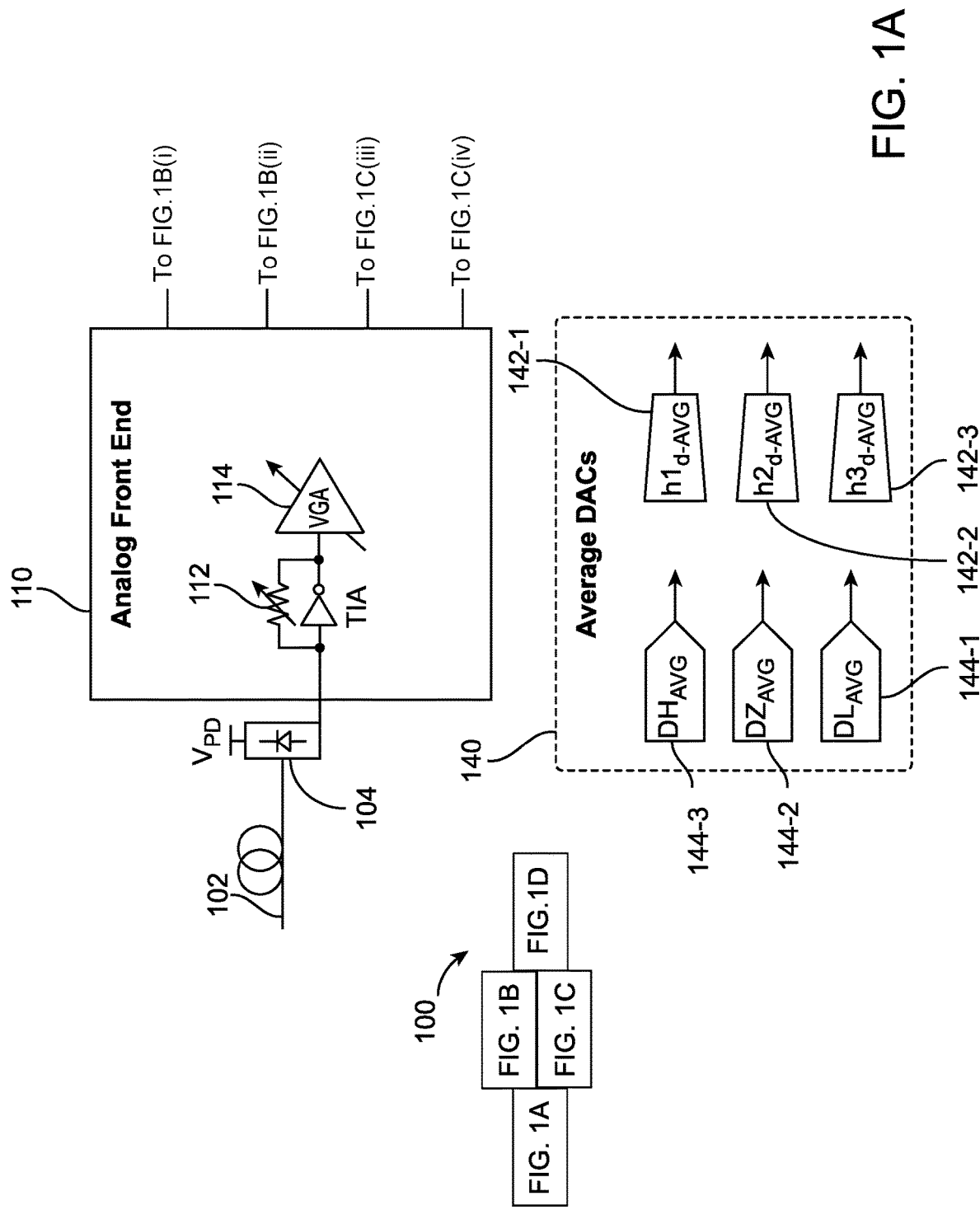
FIGS. 1A-1D illustrate a block diagram of a sub-rate receiver architecture that includes sharing of larger size coarse digital-to-analog converters (DACs) across sub-rate receiver lanes and the use of smaller fine DACs specific to the individual sub-rate receiver lanes to account for small offsets/mismatches with respect to the larger size DACs, according to an example embodiment.

Briefly, a receiver is provided that includes a plurality of sub-rate receiver lanes each of which is configured to receive an analog receive signal from an analog front-end and produce digital sub-rate receiver data. The receiver includes one or more first digital-to-analog converters (DACs) (also referred to herein as "average" DACs) shared across the plurality of sub-rate receiver lanes, and one or more second DACs (also referred to herein as "mismatch cancellation" DACs) for each sub-rate receiver lane of the plurality of sub-rate receiver lanes. The one or more second DACs of a respective sub-rate receiver lane are configured to provide output to be combined with an output of a corresponding one of the one or more first DACs during processing of the analog receive signal in the respective sub-rate receiver lane to account for a sub-rate receiver lane specific offset and mismatch with respect to a corresponding one of the one or more first DACs. A logic circuit is provided that is configured to generate a first DAC control for each of the one or more first DACs and a second DAC control for each second DAC of each of the plurality of sub-rate receiver lanes.

Example Embodiments

Presented herein are embodiments that allow a sub-rate receiver architecture to overcome lane dependent mismatch with an area efficient technique and optimize the signal-to-noise radio (SNR) for per sub-rate lane and achieve high sensitivity.

A mismatch adaptive sub-rate receiver architecture is provided. This sub-rate architecture reduces the area for mismatch adaptation digital-to-analog converters (DACs) by sharing first larger size DACs across receiver lanes while utilizing second smaller per receiver lane DACs for mismatch/offset cancellation. An adaption engine is also disclosed to provide control signals to the larger average DACs and to the smaller mismatch cancellation DACs, simultaneously. The receiver architecture presented herein, with the adaptation engine, enables cancellation of the mismatch impact on inter-symbol interference (ISI) in an area efficient manner.

FIGS. 1A-1D is a block diagram of a mismatch adaptive sub-rate receiver architecture, according to an example embodiment. The receiver 100 may be used for receive processing optical signals received over an optical fiber, such as optical fiber 102, that is coupled to a photodiode 104. The receiver 100 includes an analog front-end 110 coupled to the output of the photodiode 104. The analog front-end 110 may include a transimpedance amplifier (TIA) 112 and a variable gain amplifier 114. While the present disclosure refers to an optical receiver architecture, these techniques are applicable to electrical receiver architectures.

In a quarter-rate receiver architecture, there are four sub-rate (quarter-rate) receiver lanes. Thus, the receiver 100 includes four sub-rate receiver lanes 120-1, 120-2, 120-3, and 120-4, also denoted quarter lanes 0-3 or sub-rate domains 000, 090, 180, and 270, respectively. In general, the number of sub-rate receiver lanes depends on the sub-rate degree employed. If the receiver 100 is configured for a ⅛ sub-rate architecture, then the receiver 100 would include eight sub-rate receiver lanes. The concepts presented herein are applicable to a receiver that employs any type of sub-rate receiver architecture (one-half, one-quarter, one-eighth, etc.)

The receiver 100 also includes a block of first larger digital-to-analog converters (DACs) 140, called "average" DACs because they are controlled to account for an averaging across the sub-rate receiver lanes. The receiver 100 also further includes a deserializer (e.g., 4:64 deserializer) 150, a tap weight/slicer threshold adaptation engine 160 and a clock and data recovery (CDR) block 170. The block of average DACs 140 are shared across the sub-rate receiver lanes 120-1 to 120-4, as described further below. The tap weight/slicer threshold adaptation engine 160 may be embodied by digital logic circuitry (i.e., digital logic gates in field programmable gate array or an application specific integrated circuit) or may be embodied by software instructions running on a microprocessor or microcontroller. As will become apparent from the following, the receiver 100 also includes a block of second smaller DACs, called mismatch cancellation DACs because they are controlled to account for the offset or mismatch cancellation from the average DACs on a sub-rate receiver lane specific basis. The receiver 100 involves the sharing of larger size coarse DACs across sub-rate receiver lanes and the use of smaller fine DACs specific to the individual sub-rate receiver lanes to account for small offsets/mismatches with respect to the larger size DACs.

The analog front-end 110 outputs an analog receive signal. Each sub-rate receiver lane 120-1 to 120-4 obtains the analog receive signal from the analog front-end 110 and performs decision feedback equalizing and slicer threshold processing of the analog receive signal in its respective sub-rate domain. To this end, each of the sub-rate receiver lanes 120-1 to 120-4 includes a distributed decision feedback equalizer (DFE). For example, here a Pulse Amplitude Modulation-4 (PAM-4) modulation scheme is used, and each sub-rate receiver lane includes a 3-tap DFE to equalize inter symbol interference (ISI). However, it is to be understood that the techniques presented herein are applicable to other types of equalizations, such as that achieved with a Feed-Forward Equalizer (FFE), and may be used with a combination FFE+DFE equalization processing scheme. Furthermore, these techniques are applicable to any sub-rate electrical/optical receiver and any direct-detect modulation scheme such as Non-Return to Zero (NRZ), PAM-4, PAM-6 etc.

Each sub-rate receiver lane 120-1 to 120-4 includes a transconductance (Gm) amplifier 122. Sub-rate receiver lane 120-1 further includes a 3-tap DFE 124-1 that comprises a DFE summer node 125-1, three mismatch tap cancellation DACs 126-1A, 126-1B, and 126-1C, one for each DFE tap, a block of decision slicers 128-1A, 128-1B, and 128-1C and two delay blocks 132-1 and 134-1. Post-cursor cancellation data bits (DA, DB, and DC) control the ISI cancellation current going to the DFE summer node 125-1. The outputs of each of the mismatch tap cancellation DACs 126-1A, 126-1B, and 126-1C are combined with an output of a respective average DAC. That is, the output of mismatch tap cancellation DAC 126-1A is combined with the output of average tap weight DAC 142-1, the output of mismatch tap cancellation DAC 126-1B is combined with the output of average tap weight DAC 142-2, and the output of mismatch tap cancellation DAC 126-1C is combined with the output of average tap weight DAC 142-3.

Figure 1B:
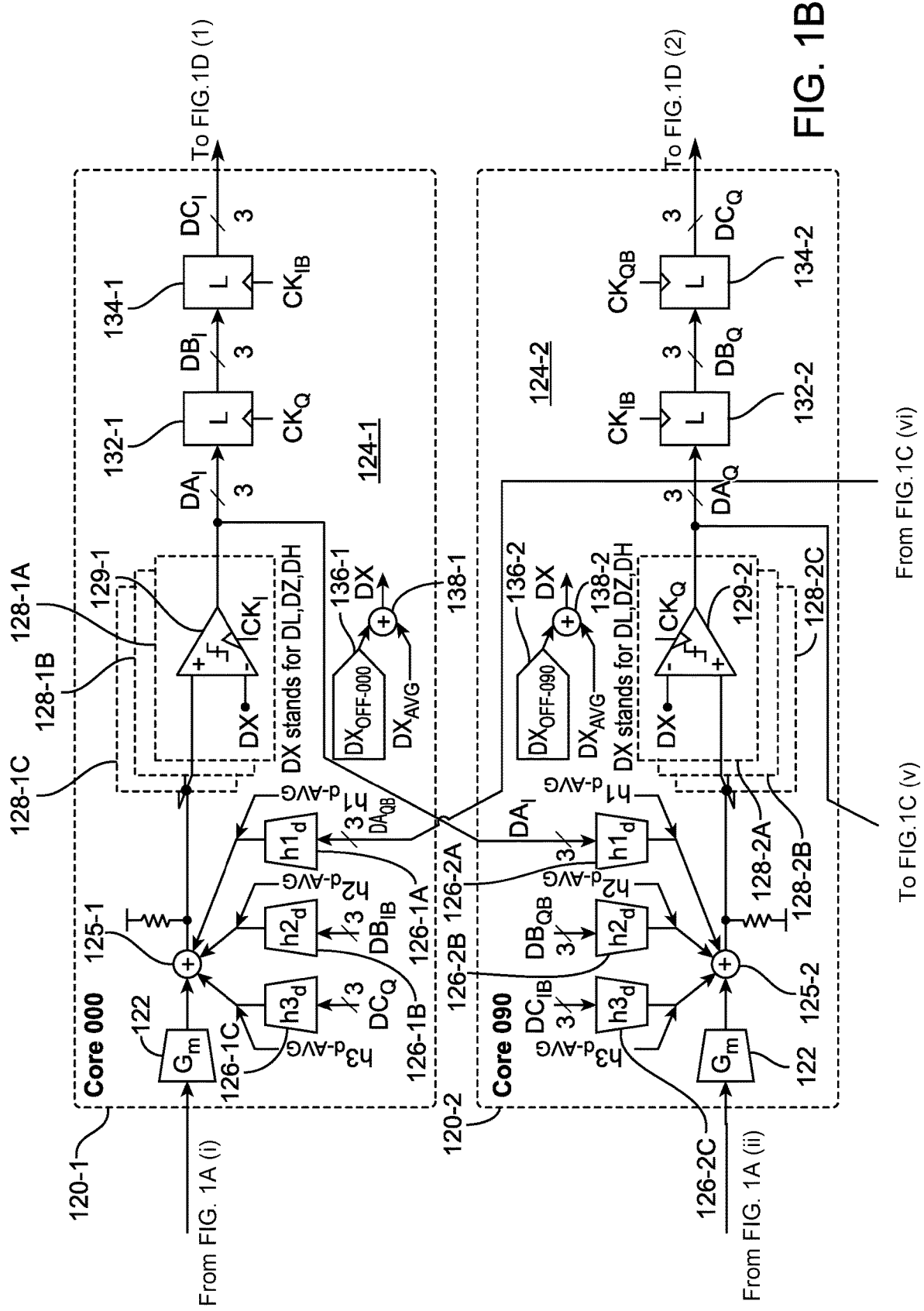

Each decision slicer 128-1A, 128-1B, and 128-1C includes a threshold slicer 129-1 that receives the output of the DFE summer node 125-1. The decision slicers 128-1A, 128-1B, and 128-1C perform thresholding with respect to a corresponding one of three different thresholds: low (L), zero (Z), and high (H) in the middle of three eyes, for a PAM-4 modulation scheme, as an example. For example, decision slicer 128-1A performs decision slicing with respect to a threshold referred to as DL, decision slicer 128-1B performs decision slicing with respect to a threshold referred to as DZ, and decision slicer 128-1C performs decision slicing with respect to a threshold referred to as DH. The decision thresholds DL, DZ, and DH, are generically denoted by DX. The delay blocks 132-1 and 134-1 form the delay functions—to store previous symbol values as employed for decision feedback equalization, as depicted in FIG. 1B.

Sub-rate receiver lane 120-2 includes a 3-tap DFE 124-2 that comprises a DFE summer node 125-2, three mismatch tap cancellation DACs 126-2A, 126-2B and 126-2C, a block of decision slicers 128-2A, 128-2B, and 128-1C and two delay blocks 132-2 and 134-2. Each decision slicer 128-2A, 128-2B, and 128-2C includes a threshold slicer 129-2 that receives the output of the DFE 124-2 (at the DFE summer node 125-2). The outputs of each of the mismatch tap cancellation DACs 126-2A, 126-2B, and 126-2C are combined with an output of a respective average DAC. The output of mismatch tap cancellation DAC 126-2A is combined with the output of average tap weight DAC 142-1, the output of mismatch tap cancellation DAC 126-2B is combined with the output of average tap weight DAC 142-2, and the output of mismatch tap cancellation DAC 126-2C is combined with the output of average tap weight DAC 142-3.

Sub-rate receiver lane 120-3 further includes a 3-tap DFE 124-3 that comprises a DFE summer node 125-3, mismatch tap cancellation DACs 126-3A, 126-3B and 126-3C, a block of decision slicers 128-3A, 128-3B, and 128-3C and two delay blocks 132-3 and 134-3. Each decision slicer 128-3A, 128-3B, and 128-3C includes a threshold slicer 129-3 that receives the output of the DFE 124-3 (at the DFE summer node 125-3). The outputs of each of the mismatch tap cancellation DACs 126-3A, 126-3B, and 126-3C are combined with an output of a respective average DAC. The output of mismatch tap cancellation DAC 126-3A is combined with the output of average tap weight DAC 142-1, the output of mismatch tap cancellation DAC 126-3B is combined with the output of average tap weight DAC 142-2, and the output of mismatch tap cancellation DAC 126-3C is combined with the output of average tap weight DAC 142-3.

Similarly, sub-rate receiver lane 120-4 further includes a 3-tap DFE 124-4 that comprises a DFE summer node 125-4, three mismatch tap cancellation DACs 126-4A, 126-4B and 126-4C, a block of decision slicers 128-4A, 128-4B, and 128-4C and two delay blocks 132-4 and 134-4. Each decision slicer 128-4A, 128-4B, and 128-4C includes a threshold slicer 129-4 that receives the output of the DFE 124-4 (at the DFE summer node 125-4). The outputs of each of the mismatch tap cancellation DACs 126-4A, 126-4B, and 126-4C are combined with an output of a respective average DAC. The output of mismatch tap cancellation DAC 126-4A is combined with the output of average tap weight DAC 142-1, the output of mismatch tap cancellation DAC 126-4B is combined with the output of average tap weight DAC 142-2, and the output of mismatch tap cancellation DAC 126-4C is combined with the output of average tap weight DAC 142-3.

Figure 1C:
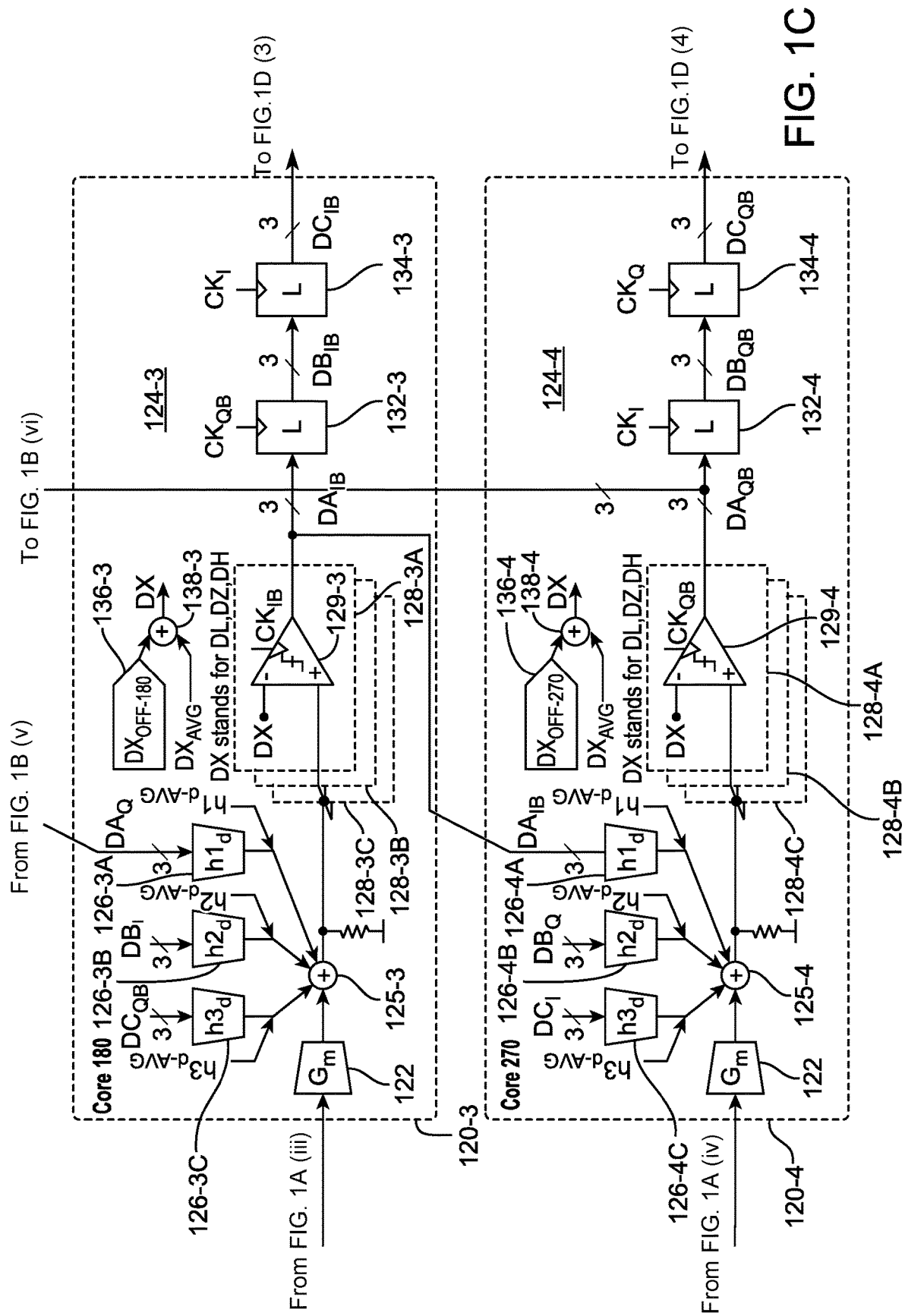

Each sub-rate receiver lane 120-1 to 120-4 further includes a mismatch slicer threshold DAC for each of the thresholds L, Z, and H, but for simplicity only one mismatch slicer threshold DAC is shown in each sub-rate receiver lane in FIGS. 1B and 1C. Specifically, sub-rate receiver lane 120-1 includes a mismatch slicer threshold DAC 136-1 and a slicer threshold summer node 138-1 (for each of the thresholds L, Z, and H), sub-rate receiver lane 120-1 includes a mismatch slicer threshold DAC 136-2 and a slicer threshold summer node 138-2 (for each of the thresholds L, Z and H), sub-rate receiver lane 120-3 includes a mismatch slicer threshold DAC 136-3 and a slicer threshold summer node 138-3 (for each of the thresholds L, Z and H) and sub-rate receiver lane 120-4 includes a mismatch slicer threshold DAC 136-4 and a slicer threshold summer node 138-4 (for each of the thresholds L, Z, and H).

In order to minimize the area in an integrated circuit, the block of shared DACs 140 includes three average (main) tap weight DACs 142-1, 142-2, and 142-3, each associated a corresponding one of the three taps of the 3-tap DFEs 124-1 to 124-4, and shared across the sub-rate receiver lanes 120-1 to 120-4. Specifically, the average tap weight DAC 142-1 provides an average tap weight DAC value $h1_{d\text{-}AVG}$ for the first post cursor ISI cancellation that is combined with the mismatch tap cancellation value $h1_d$ (specific to sub-rate domain 000) provided by mismatch tap cancellation DAC 126-1A for the first tap of the 3-tap DFE 124-1 in sub-rate receiver lane 120-1. Similarly, the average tap weight DAC 142-1 provides the average tap weight DAC value $h1_{d\text{-}AVG}$ that is combined with the mismatch tap cancellation value $h1_d$ (specific to sub-rate domain 090) provided by mismatch tap cancellation DAC 126-2A for the first tap of the 3-tap DFE 124-2 in sub-rate receiver lane 120-2, and so on for sub-rate lanes 120-3 and 120-4.

The average tap weight DAC 142-2 provides an average tap weight DAC value $h2_{d\text{-}AVG}$ that is combined with the mismatch tap cancellation value $h2_d$. (specific to sub-rate domain 000) provided by mismatch tap cancellation DAC 126-1B for the second tap of the 3-tap DFE 124-1 in sub-rate receiver lane 120-1. Similarly, the average tap weight DAC 142-2 provides the average tap weight DAC value $h2_{d\text{-}AVG}$ for the second post cursor ISI cancellation that is combined with the mismatch tap cancellation value $h2_d$. (specific to sub-rate domain 090) provided by mismatch tap cancellation DAC 126-2B for the second tap of the 3-tap DFE 124-2 in sub-rate receiver lane 120-2, and so on for sub-rate receiver lanes 120-3 and 120-4.

Further, the average tap weight DAC 142-3 provides an average tap weight DAC value $h3_{d\text{-}AVG}$ for the third post cursor ISI cancellation that is combined with the mismatch tap cancellation value $h3_d$. (specific to sub-rate domain 000) provided by mismatch tap cancellation DAC 126-1C for the third tap of the 3-tap DFE 124-1 in sub-rate receiver lane 120-1. Similarly, the average tap weight DAC 142-3 provides the average tap weight DAC value h3-AVG that is combined with the mismatch tap cancellation value $h3_d$. (specific to sub-rate domain 090) provided by mismatch tap cancellation DAC 126-2C for the third tap of the 3-tap DFE 124-2 in sub-rate receiver lane 120-2, and so on for sub-rate receiver lanes 120-3 and 120-4.

Similarly, the block of average DACs 140 further includes average slicer threshold DACs 144-1, 144-2, and 144-3, one for each of the thresholds used by the decision slicers in each sub-rate receiver lane. Specifically, the average slicer DAC 144-1 provides an average slicer threshold value $DL_{AVG}$ for the lower eye in the PAM-4 signal level that is combined with a mismatch slicer threshold DAC value for the decision slicers 128-1A, 128-2A, 128-3A, and 128-4A (for the L threshold) in the sub-rate receiver lanes 120-1-120-4, respectively. The average slicer DAC 144-2 provides an average slicer threshold value $DZ_{AVG}$ for the middle eye in the PAM-4 signal level that is combined with a mismatch slicer threshold DAC value for the decision slicers 128-1B, 128-2B, 128-3B, and 128-4B (for the Z threshold) in the sub-rate receiver lanes 120-1-120-4, respectively. The average slicer DAC 144-3 provides an average slicer threshold value $DH_{AVG}$ for the upper eye in the PAM-4 signal level that is combined with a mismatch slicer threshold DAC value for the decision slicers 128-1C, 128-2C, 128-3C, and 128-4C (for the H threshold) in the sub-rate receiver lanes 120-1-120-4, respectively.

In a convention receiver architecture, for each tap, a DAC is used in each of the quarter rate lanes. Thus, the number of DACs is equal to the number of DFE taps. However, different quarter rate lanes can have mismatch between them. This mismatch results in different bandwidths, ISI, optimum sampling position, etc. With a limited number of DACs, this results in sub-optimal bit error rate (BER) performance.

Lane mismatch can be addressed by using independent DACs for each receiver lane. In the case of a quarter-rate receiver architecture, the number of DACs is equal to 4 times the number of DFE taps. Independent DACs can take care of ISI and bandwidth of each quarter rate lane, resulting in the optimum sampling of each sub-rate lane.

However, four relatively large size (in terms of semiconductor die area) DACs are needed for each tap weight implementation, taking up a relatively large area. Thus, using conventional techniques, mismatch adaptation comes at a significant area penalty as the number of full-sized DACs needed are four times more than a conventional receiver.

The architecture depicted in FIGS. 1A-1D is a very realistic and practical compromise. For each tap cancellation, one average tap weight DAC (h1d-AVG) is used with current mirroring across all the sub-rate receiver lanes, along with four independent small DACs in each sub-rate receiver lane, i.e., h1d-off-000, h1d-off-090, etc. The mismatch cancellation DAC range needs to be approximately less than 10% of the main or average tap weight DAC as it only has to account for the mismatch in the individual sub-rate receiver lanes. Said another way, a semiconductor area size of each respective mismatch DAC may be approximately 5-10 percent of a semiconductor area size of each average DAC.

Thus, the number of larger average or main DACs is equal to the number of DFE taps. The number of smaller mismatch cancellation DACs is equal to 4 times the number of DFE taps.

Figure 1D:
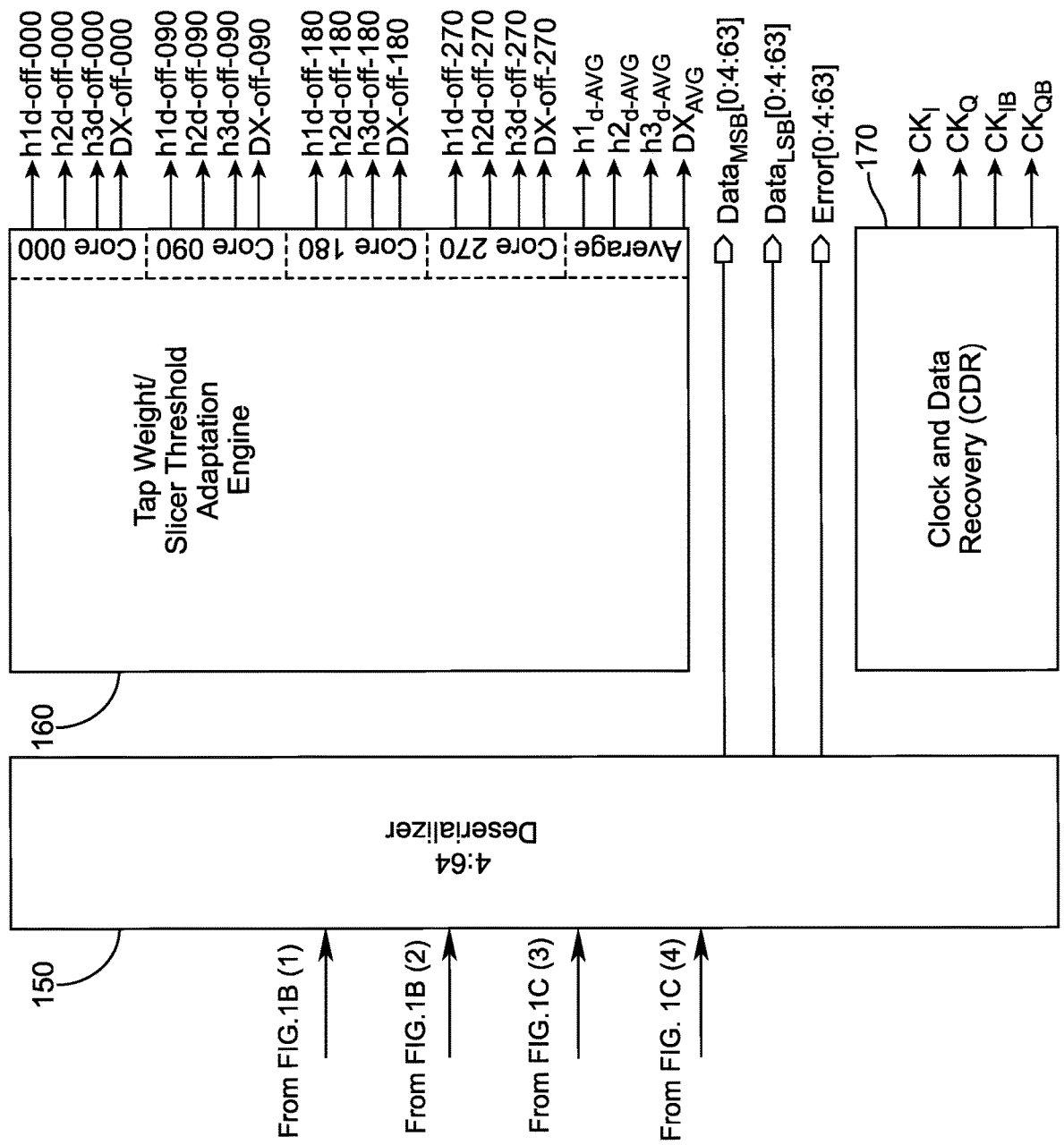

As shown in FIG. 1D, the tap weight/slicer threshold adaptation engine 160 generates average tap weight DAC controls (values) $h1_{d\text{-}AVG}$, $h2_{d\text{-}AVG}$, and $h3_{d\text{-}AVG}$ for the average tap weight DACs 142-1, 142-2, and 142-3, respectively. The tap weight/slicer threshold adaptation engine 160 generates the mismatch tap cancellation DAC controls (values) for each mismatch tap cancellation DAC in each of the plurality of sub-rate receiver lanes. In addition, the tap weight/slicer threshold adaptation engine 160 generates the average slicer threshold DAC values $DX_{AVG}$ for the average slicer threshold DACs 144-1-144-3 (for each of the L, Z, and H thresholds), and the mismatch slicer threshold values for each mismatch slicer threshold DAC 136-1, 136-2, 136-3 and 136-4 in the sub-rate receiver lanes 120-1-120-4. Thus, for sub-rate receiver lane 120-1 (sub-rate domain 000), the tap weight/slicer threshold adaptation engine 160 generates h1d-off-000, h2d-off-000, h3d-off-000 and DX-off-000 (for each of the L, Z, and H thresholds). For sub-rate receiver lane 120-2 (sub-rate domain 090), the tap weight/slicer threshold adaptation engine 160 generates h1d-off-090, h2d-off-090, h3d-off-090 and DX-off-090 (for each of the L, Z and H thresholds). For sub-rate receiver lane 120-3 (sub-rate domain 180), the tap weight/slicer threshold adaptation engine 160 generates h1d-off-180, h2d-off-180, h3d-off-180 and DX-off-180 (for each of the L, Z and H thresholds). Finally, for sub-rate receiver lane 120-4 (sub-rate domain 270), the tap weight/slicer threshold adaptation engine 160 generates h1d-off-270, h2d-off-270, h3d-off-270, and DX-off-270 (for each of the L, Z, and H thresholds).

Again, in most cases, the mismatch or offset between the average DACs that are shared across the sub-rate receiver lanes and the mismatch or offset for a given sub-rate receiver lane, may be 5-10%. Thus, smaller DACs can be used to account for the mismatch/offset cancellation. The larger average DACs are shared for each of the sub-rate receiver lanes, and then smaller "mismatch" DACs unique to each respective lane are provided to account for mismatch or offset from the average.

The clock and data recovery block 170 generates clock signals that are used by the sub-rate receiver lanes 120-1-120-4 as shown in FIGS. 1B, 1C and 1D. Specifically, the clock and data recovery block 170 generates a first pair of in-phase and quadrature clocks $CK_I$ and $CK_Q$, and a second pair of in-phase and quadrature clocks $CK_{IB}$ and $CK_{QB}$. The deserializer 150 receives the outputs of the sub-rate receiver lanes 120-1-120-4 and generates most significant bit data ($Data_{MsB}$), least significant bit data ($Data_{LsB}$) and Error bits. The Error bits are derived from a slicer in addition to DH, DZ, and DL and are used in the tap weight/slicer threshold adaptation engine 160. For simplicity, this additional slicer is not shown in the figures.

Figure 2A:
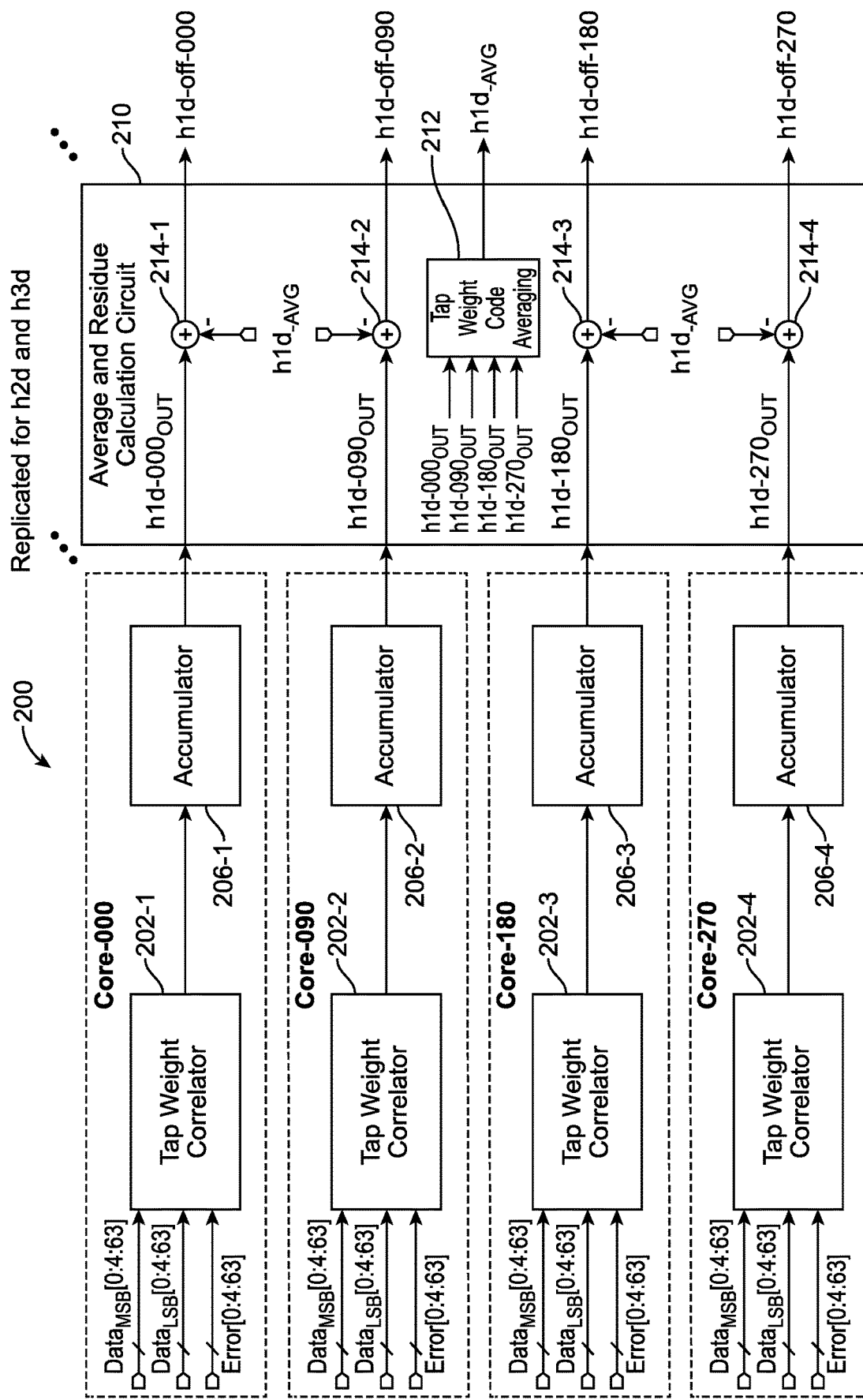
FIGS. 2A and 2B are block diagrams of logic circuitry configured to generate controls for the larger DACs and smaller DACs in the sub-rate receiver architecture depicted in FIGS. 1A-1D, according to an example embodiment.

Reference is now made to FIG. 2A, with continued reference to FIGS. 1A-1D. FIG. 2A shows a tap weight computation section 200 of the tap weight/slicer threshold adaptation engine 160. The arrangement shown in FIG. 2A is just for h1d (for the DACs associated with the first tap of the DFE in each sub-rate receiver lane). The same arrangement is used for $h2_d$ and $h3_d$, not shown to avoid redundancy and to simplify the figure.

The tap weight computation section 200 of the tap weight/slicer threshold adaptation engine 160 is run on a per quarter-rate receiver lane basis to determine the tap weights for a particular receiver lane. For each sub-rate domain, the tap weight computation section 200 includes a tap weight correlator and an accumulator. For sub-rate domain 000, there is a tap weight correlator 202-1 and an accumulator 206-1. For sub-rate domain 090, there is a tap weight correlator 202-2 and an accumulator 206-2, for sub-rate domain 180, there is a tap weight correlator 202-3 and an accumulator 206-3, and for sub-rate domain 270, there is a tap weight correlator 202-4 and an accumulator 206-4.

The tap weight correlators 202-1-202-4 receive as input the Data and Error output by the deserializer 150 (FIG. 1D). The tap weight correlators try to determine the correlation factor between incoming deserialized $Data_{MsB}$ and $Data_{LsB}$ and the Error on a bit-by-bit basis for each of the lanes to produce an output that is provided to the accumulators 206-1-206-4. For different tap weights, a different sequence of correlation is calculated. For example, for the first post cursor ISI cancellation tap $h1_d$, the current error bit is correlated with the one unit interval (UI) delayed $Data_{MsB}$ and $Data_{LsB}$ bits. Similarly, the second post cursor ISI cancellation tap $h2_d$, the current error bit is correlated with the 2 UI delayed $Data_{MsB}$ and $Data_{LsB}$ bits, and the third post cursor ISI cancellation tap $h3_d$, the current error bit is correlated with the 3 UI delayed $Data_{MsB}$ and $Data_{LsB}$ bits. This correlator output along with an accumulator forms a Least Mean Square (LMS) estimator that helps estimate the magnitude and the sign of ISI present on each post-cursor tap. The output of the accumulators 206-1-206-4 contain the final value of the post-cursor ISI on a per-lane basis. It is noted that in place of an LMS correlator/estimator as shown, other types of correlators/optimizers, such as gradient descent, etc., can also be used depending upon the bit error rate and other application requirements.

The outputs for each sub-rate domain, e.g., h1d-$000_{ouT}$ from accumulator 206-1, h1d-$090_{ouT}$ from accumulator 206-2, h1d-$180_{ouT}$ from accumulator 206-3, and h1d-$270_{ouT}$ from accumulator 206-4 are coupled to an average and residue calculation circuit 210. The average and residue calculation circuit 210 includes a tap weight code averaging block 212 and summers 214-1, 214-2, 214-3, and 214-4. The tap weight code averaging block 212 receives as input the outputs h1d-$000_{ouT}$, h1d-$090_{ouT}$, h1d-$180_{ouT}$, and h1d-$270_{ouT}$ from the accumulators 206-1 to 206-4, respectively. The tap weight code averaging block 212 computes the average tap weight DAC code that is fed to main DAC 142-1, e.g., $h1_{d-AVG}$, for the first DFE tap of the DFE's 124-1 to 124-1, shared across the sub-rate receiver lanes. The summers 214-1, 214-2, 214-3, and 214-4 each compute a sub-rate domain specific (sub-rate receiver lane specific) difference from the average tap weight DAC code. Specifically, summer 214-1 computes the difference between $h1_{d-AVG}$ and h1d-$000_{ouT}$ and the result is the offset DAC code h1d-off-000 that is used for the mismatch cancellation DAC 126-1A in sub-rate receiver lane 120-1. The summer 214-2 computes the difference between the $h1_{d-AVG}$ and h1d-$090_{ouT}$ and the result is the offset DAC code h1d-off-090 that is used for the mismatch cancellation DAC 126-2A in sub-rate receiver lane 120-2. The summer 214-3 computes the difference between the $h1_{d-AVG}$ and h1d-$180_{ouT}$ and the result is the offset DAC code h1d-off-180 that is used for the mismatch cancellation DAC 126-3A in sub-rate receiver lane 120-3. Lastly, the summer 214-4 computes the difference between the $h1_{d-AVG}$ and h1d-$270_{ouT}$ and the result is the offset DAC code h1d-off-270 that is used for the mismatch cancellation DAC 126-4A in sub-rate receiver lane 120-4.

Thus, the tap weight computation section 200 of the tap weight/slicer threshold adaptation engine 160 determines the average tap weight values that can be used for the larger DACs that are shared across the four sub-rate receiver lanes, and smaller offset values from that average that can be handled by smaller DACs in each of the respective sub-rate receiver lanes. Normally, the mismatch to be accounted for is 5-10%, again, for which much smaller DACs can be used. The larger average DACs are shared across each of the sub-rate receiver lanes, and the smaller "mismatch" DACs unique to each respective lane are used to account for the mismatch or offset from the average.

As explained above, the circuitry shown in FIG. 2A is replicated to compute $h2_{d-AVG}$ and $h3_{d-AVG}$ for the main or average DACs 142-2 and 142-3 shared across the respective DFE taps in the sub-rate receiver lanes, and the sub-rate receiver lane specific smaller offset values used for the mismatch DACs in the respective sub-rate receiver lanes.

Figure 2B:
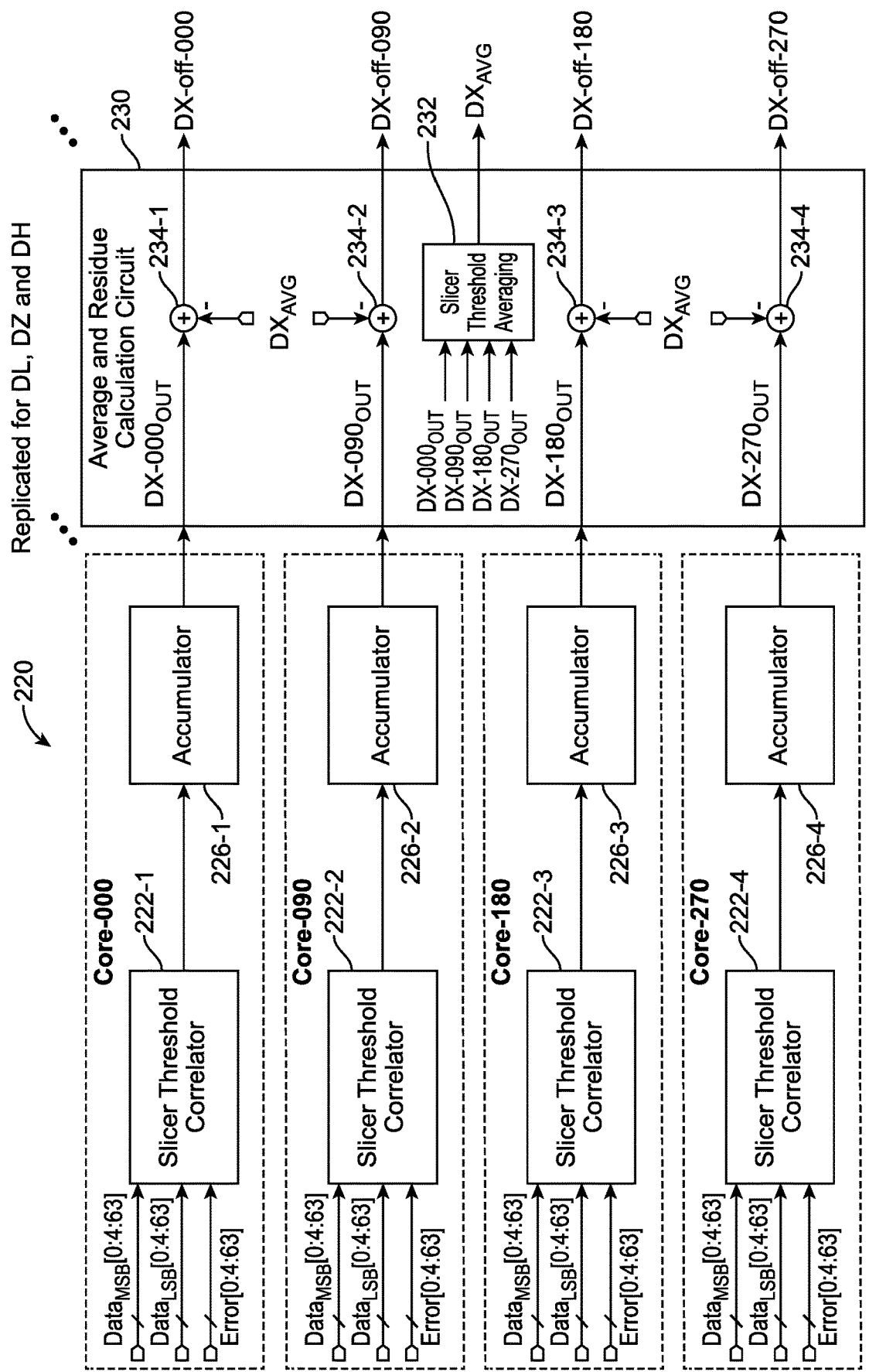

Reference is now made to FIG. 2B, which shows a slicer threshold computation section 220 of the tap weight/slicer threshold adaptation engine 160. The slicer threshold computation section 220 computes the average slicer threshold DAC values used for the larger DACs that are shared across the sub-rate receiver lanes, and smaller offset values from that average that can be handled by smaller DACs in each of the respective sub-rate receiver lanes. The slicer threshold computation section 220 has a similar arrangement as the tap weight computation section 200 shown in FIG. 2A. The slicer threshold computation section 220 includes a slicer threshold correlator and an accumulator for each sub-rate domain. For sub-rate domain 000, there is a slicer threshold correlator 222-1 and an accumulator 226-1. For sub-rate domain 090, there is a slicer threshold correlator 222-2 and an accumulator 226-2, for sub-rate domain 180, there is a slicer threshold correlator 222-3 and an accumulator 226-3, and for sub-rate domain 270, there is a slicer threshold correlator 222-4 and an accumulator 226-4.

The outputs for each sub-rate domain, e.g., DX-$000_{ouT}$ from accumulator 226-1, DX-$090_{ouT}$ from accumulator 226-2, DX-$180_{ouT}$ from accumulator 226-3, and DX-$270_{OuT}$ from accumulator 226-4 are coupled to an average and residue calculation circuit 230. The average and residue calculation circuit 230 includes a slicer threshold averaging block 232 and summers 234-1, 234-2, 234-3, and 234-4. The slicer threshold averaging block 232 receives as input the outputs DX-000$_{ouT}$, DX-090$_{ouT}$, DX-180$_{ouT}$, and DX-270$_{ouT}$ from the accumulators 226-1 to 226-4, respectively. The slicer threshold averaging block 232 computes the average slicer DAC control that is fed to the average DAC, for each of the thresholds L, Z, and H.

For example, for L threshold slicing, the slicer threshold averaging block 232 computes the average slicer DAC control DL$_{AVG}$ that is provided to the DAC 144-1, and similarly, for the Z threshold, computes the average slicer DAC control DZ$_{AVG}$ that is provided to the DAC 144-2, and computes the average slicer DAC control DH$_{AVG}$ that is provided to the DAC 144-3. Again, each of DACs 144-1, 144-2, and 144-3 are shared across the sub-rate receiver lanes.

The summers 234-1, 234-2, 234-3 and 234-4 each compute the difference from the average tap weight DAC control. Specifically, summer 234-1 computes the difference between DX$_{AVG}$ and DX-000$_{ouT}$ and the result is the offset DAC control DX-off-000 that is used for the mismatch DAC 136-1 in sub-rate receiver lane 120-1. The summer 234-2 computes the difference between the DX$_{AVG}$ and DX-090$_{ouT}$ and the result is the offset DAC control DX-off-090 that is used for the mismatch DAC 136-2 in sub-rate receiver lane 120-2. The summer 234-3 computes the difference between the DX$_{AVG}$ and DX-180$_{ouT}$ and the result is the offset DAC control DX-off-180 that is used for the mismatch DAC 136-3 in sub-rate receiver lane 120-3. Lastly, the summer 234-4 computes the difference between the DX$_{AVG}$ and DX-270$_{ouT}$ and the result is the offset DAC control DX-off-270 that is used for the mismatch DAC 136-4 in sub-rate receiver lane 120-4. Again, this arrangement is replicated for each of the L, Z, and H slicer thresholds.

Figure 3:
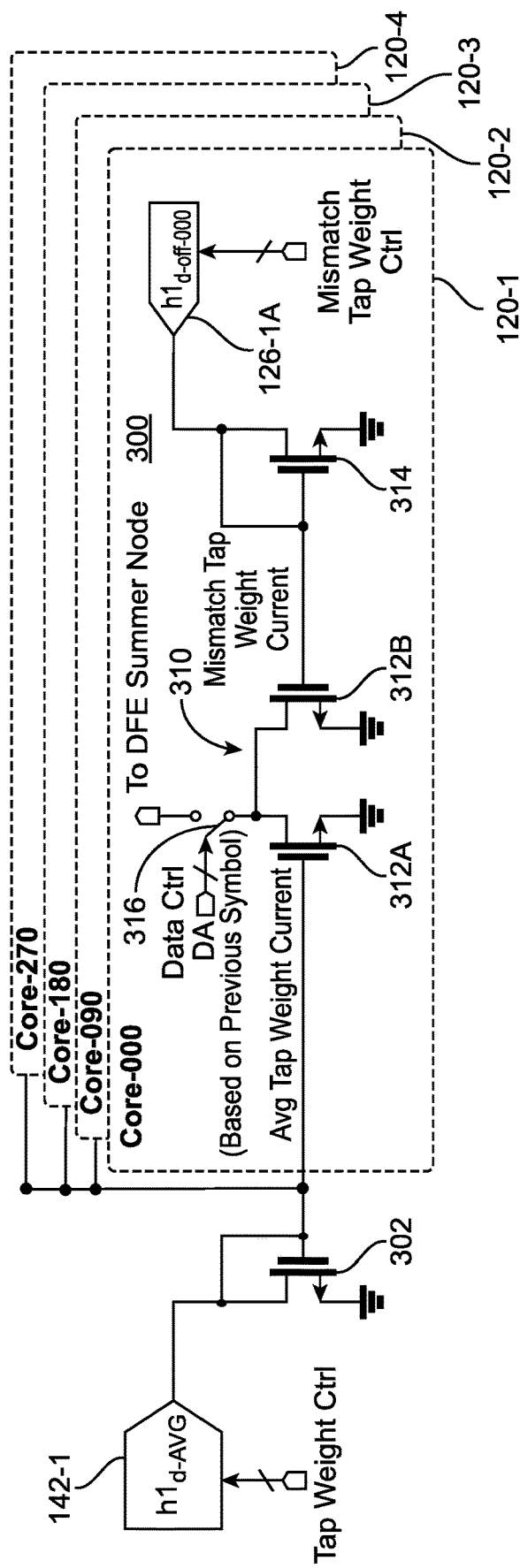
FIGS. 3 and 4 are diagrams of circuitry to combine output of the larger size DACs with output of the smaller size DACs for each sub-rate receiver lane, according to an example embodiment.

Reference is now made to FIG. 3. FIG. 3 illustrates a DFE tap current circuit 300 used in each sub-rate receiver lane to apply the output of the larger average DAC with the output of the smaller mismatch cancellation DAC, for a given DFE tap. The same DFE tap circuit 300 is replicated for each DFE tap, but for simplicity FIG. 3 shows the DFE tap current circuit 300 only for one DFE tap. Moreover, the DFE tap current circuit 300 is replicated in each of the sub-rate receiver lanes 120-1 to 120-4, but for simplicity is shown only for sub-rate receiver lane 120-1. While FIG. 3 shows an example using current DACs it is to be understood that similar techniques may be performed using voltage DACs, and the use of current DACs is not to be limiting.

The output of the average tap weight DAC 142-1 is converted to a current, via N-channel metal-oxide semiconductor (nMOS) transistor 302, and this average tap weight current is mirrored across all four sub-rate receiver lanes 120-1 to 120-4 and a mismatch cancellation current is added independently for each of the sub-rate receiver lanes. Specifically, the DFE tap current circuit 300 includes a current mirror 310 comprising two nMOS transistors 312A and 312B. The DFE tap current circuit 300 further includes another nMOS transistor 314 that receives the output of the mismatch cancellation DAC 126-1A. There is a switch 316 at the output of the current mirror 310 that controls when the output of the current mirror 310 is coupled to the DFE summer node 125-1 (not shown in FIG. 3). The switch 316 is responsive to a data control signal DA, shown in FIGS. 1B and 1C. The DA control signal represents the previous decision symbol.

The average tap weight DAC 142-1 receives as input a tap weight control (Ctrl) that provides the appropriate value h1$_{d\text{-}AVG}$ computed by the tap weight/slicer threshold adaptation engine 160. Similarly, the mismatch cancellation DAC 126-1A receives as input a mismatch tap weight control that provides the appropriate value h1$_{d\text{-}off\text{-}000}$ computed by the tap weight/slicer threshold adaptation engine 160. The current mirror 310 combines an average tap weight current supplied from transistor 302 to transistor 312A, with a mismatch tap weight current supplied from transistor 314 to transistor 312B, and a resulting tap weight current, when switch 316 is closed, is coupled to the DFE summer node for the DFE summer node 125-1 for sub-rate receiver lane 120-1. As an alternate implementation, if the DAC current direction is switched from a source to a sync type, all the current mirror and summing devices would be changed from nMOS to pMOS. Similarly, in place of a current DAC, a voltage DAC and a voltage summer can also be used for implementation. The DAC and the tap weight cancellation can also be implemented in a differential manner.

Figure 4:
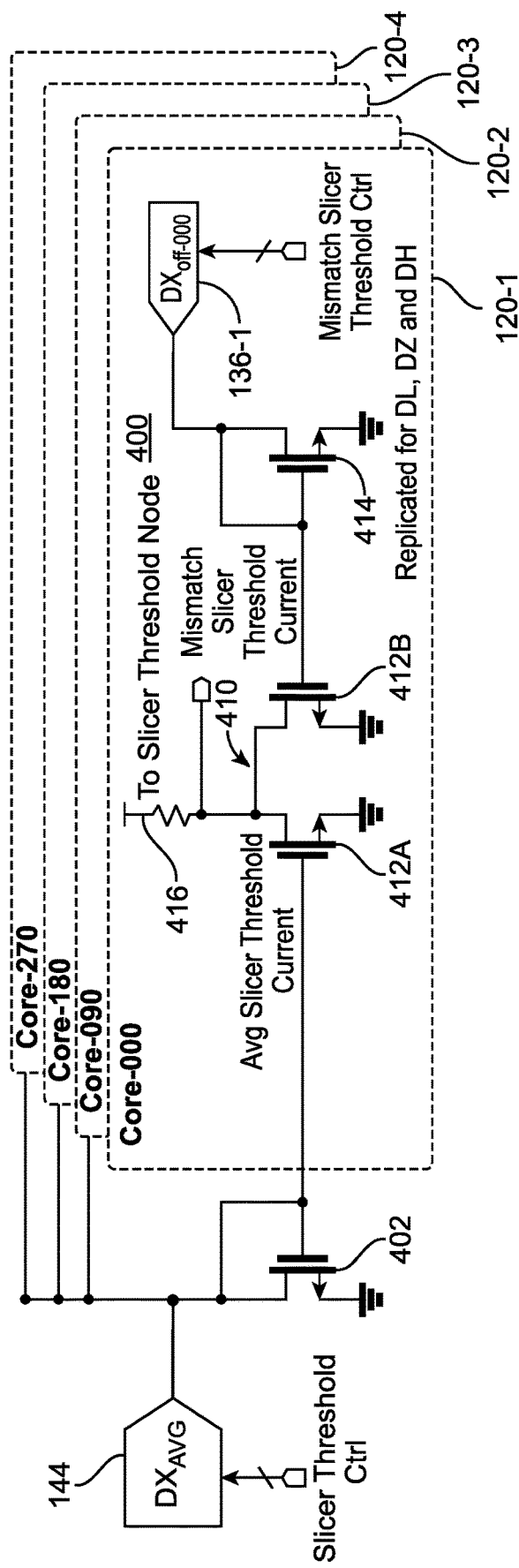

Reference is now made to FIG. 4. FIG. 4 shows a slicer threshold circuit 400 that is employed for each decision slicer in each of the sub-rate receiver lanes. For simplicity, FIG. 4 shows the slicer threshold circuit 400 for the decision slicer for one of the L, Z, and H thresholds, using the "X" nomenclature also used in FIGS. 1A-1D. The average slicer DAC (DX$_{AVG}$) is shown generically at 144 using the "X" nomenclature to represent each of the DACs 144-1, 144-2, and 144-3 shown in FIGS. 1B and 1C. Similarly, the mismatch slicer threshold DAC (DX$_{off\text{-}000}$) is shown generically at 136-1 to represent the mismatch slicer threshold DACs for each of the L, Z, and H thresholds.

The output of the average slicer DAC 144 is converted to a current by an nMOS transistor 402. Again, this is done for each of the L, Z and H decision slicers, and the average slicer threshold current (for each of the L, Z, and H thresholds) is mirrored across all four sub-rate receiver lanes 120-1 to 120-4, and a mismatch slicer current is added independently for each of the sub-rate receiver lanes. Specifically, the slicer threshold circuit 400 includes a current mirror 410 comprising two nMOS transistors 412A and 412B. The slicer threshold circuit 400 further includes another nMOS transistor 414 that receives the output of the mismatch slicer DAC 136-1. There is a resistor 416 at the output of the current mirror 410 that controls converts the current output by the current mirror 410 to a voltage that is coupled to the slicer threshold summer node 138-1 (not shown in FIG. 4).

The average slicer DAC 144 receives as input a slicer control that provides the appropriate average slicer threshold value computed by the tap weight/slicer threshold adaptation engine 160. Similarly, the mismatch slicer DAC threshold 136-1 receives as input a mismatch slicer threshold control that provides the appropriate value DX$_{off\text{-}000}$ computed by the tap weight/slicer threshold adaptation engine 160. The current mirror 410 combines an average slicer threshold current supplied from transistor 402 to transistor 412A, with a mismatch slicer threshold current supplied from transistor 414 to transistor 412B, and a resulting slicer threshold voltage across resistor 416 is coupled to the slicer threshold summer node 138-1 for sub-rate receiver lane 120-1. As an alternate implementation, if the DAC current direction is switched from a source to a sync type, all the current mirror and summing devices would be changed from nMOS to pMOS. Similarly, in place of a current DAC, a voltage DAC and a voltage summer can also be used for implementation. The DACs and the slicer decision control can also be implemented in a differential manner.

In summary, with higher data rates, sub-rate receiver architectures, such as half-rate or quarter-rate are becoming more prevalent. The embodiments presented herein introduce a mismatch adaptive sub-rate receiver architecture that enables canceling mismatch impact on ISI in an area efficient manner. The semiconductor area for mismatch adaptation DACs is reduced by sharing average DACs across sub-rate receiver lanes, while utilizing small per receiver lane, DACs for mismatch effect cancellation. In addition, a computation engine provides control signals to the average DAC and mismatch cancellation DACs, simultaneously.

Figure 5:
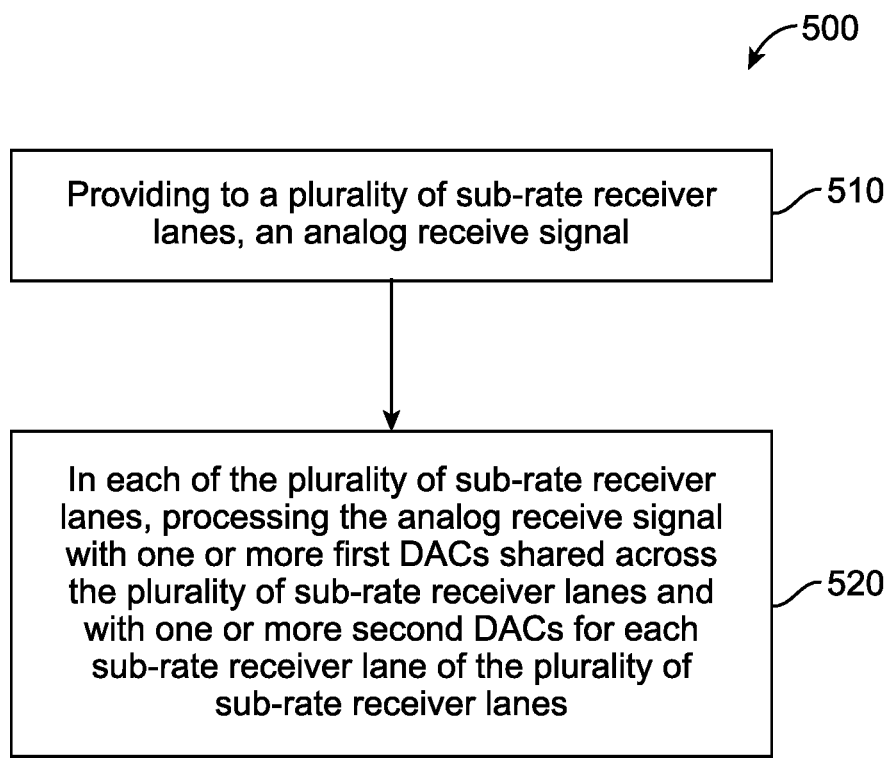
FIG. 5 is a flow chart depicting a method for performing processing of an analog receive signal by a plurality of sub-rate receiver lanes using larger size DACs and smaller size DACs that account for offset/mismatch in the individual sub-rate receiver lanes, according to an example embodiment.

Reference is now made to FIG. 5. FIG. 5 depicts a flow chart for a method 500 that employs the concepts presented herein. At step 510, the method 500 involves providing to a plurality of sub-rate receiver lanes, an analog receive signal. The analog receive signal may be derived from a received wired signal, received wireless signal, or receive optical signal (free-space or within an optical fiber). At step 520, the method 500 involves, in each of the plurality of sub-rate receiver lanes, processing the analog receive signal with one or more first DACs (so-called "average" DACs herein) shared across the plurality of sub-rate receiver lanes and with one or more second DACs (so-called "mismatch" DACs herein) for each sub-rate receiver lane of the plurality of sub-rate receiver lanes. The one or more second DACs of a respective sub-rate receiver lane are configured to provide output to be combined with an output of a corresponding one of the one or more first DACs to account for a sub-rate receiver lane specific offset with respect to a corresponding one of the one or more first DACs.

Figure 6:
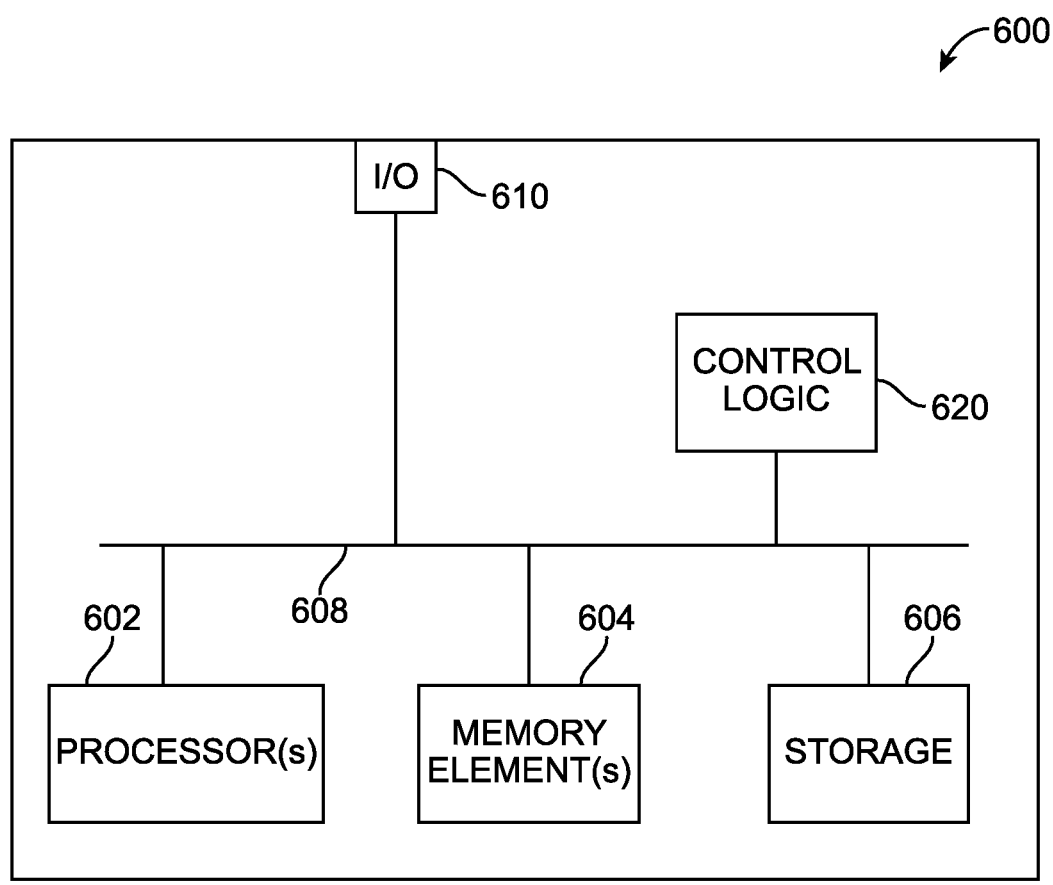
FIG. 6 is a block diagram of a computing arrangement that may serve to compute the DAC controls used in the sub-rate receiver architecture depicted in FIGS. 1A-1D, according to an example embodiment.

Referring to FIG. 6, FIG. 6 illustrates a hardware block diagram of a computing device 600 that may be representative of the tap weight/slicer threshold computation engine 160 described herein.

In at least one embodiment, the computing device 600 may include one or more processor(s) 602, one or more memory element(s) 604, storage 606, a bus 608, one or more I/O interface(s) 610, and control logic 620. In various embodiments, instructions associated with logic for computing device 600 can overlap in any manner and are not limited to the specific allocation of instructions and/or operations described herein.

In at least one embodiment, processor(s) 602 is/are at least one hardware processor configured to execute various tasks, operations, and/or functions for computing device 600 as described herein according to software and/or instructions configured for computing device 600. Processor(s) 602 (e.g., a hardware processor) can execute any type of instructions associated with data to achieve the operations detailed herein. In one example, processor(s) 602 can transform an element or an article (e.g., data, information) from one state or thing to another state or thing. Any of potential processing elements, microprocessors, digital signal processor, logic, and/or machines described herein can be construed as being encompassed within the broad term 'processor'.

In at least one embodiment, memory element(s) 604 and/or storage 606 is/are configured to store data, information, software, and/or instructions associated with computing device 600, and/or logic configured for memory element(s) 604 and/or storage 606. For example, any logic described herein (e.g., control logic 620) can, in various embodiments, be stored for computing device 600 using any combination of memory element(s) 604 and/or storage 606. Note that in some embodiments, storage 606 can be consolidated with memory element(s) 604 (or vice versa), or can overlap/exist in any other suitable manner.

In at least one embodiment, bus 608 can be configured as an interface that enables one or more elements of computing device 600 to communicate in order to exchange information and/or data. Bus 608 can be implemented with any architecture designed for passing control, data, and/or information between processors, memory elements/storage, peripheral devices, and/or any other hardware and/or software components that may be configured for computing device 600. In at least one embodiment, bus 608 may be implemented as a fast kernel-hosted interconnect, potentially using shared memory between processes (e.g., logic), which can enable efficient communication paths between the processes.

In various embodiments, I/O interface(s) 610 allow for input and output of data and/or information with other entities that may be connected to computing device 600.

In various embodiments, control logic 620 can include instructions that, when executed, cause processor(s) 602 to perform operations, which can include, but not be limited to, providing overall control operations of computing device; interacting with other entities, systems, etc. described herein; maintaining and/or interacting with stored data, information, parameters, etc. (e.g., memory element(s), storage, data structures, databases, tables, etc.); combinations thereof; and/or the like to facilitate various operations for embodiments described herein.

The programs described herein (e.g., control logic 620) may be identified based upon application(s) for which they are implemented in a specific embodiment. However, it should be appreciated that any particular program nomenclature herein is used merely for convenience; thus, embodiments herein should not be limited to use(s) solely described in any specific application(s) identified and/or implied by such nomenclature.

In various embodiments, entities as described herein may store data/information in any suitable volatile and/or non-volatile memory item (e.g., magnetic hard disk drive, solid state hard drive, semiconductor storage device, random access memory (RAM), read only memory (ROM), erasable programmable read only memory (EPROM), application specific integrated circuit (ASIC), etc.), software, logic (fixed logic, hardware logic, programmable logic, analog logic, digital logic), hardware, and/or in any other suitable component, device, element, and/or object as may be appropriate. Any of the memory items discussed herein should be construed as being encompassed within the broad term 'memory element'. Data/information being tracked and/or sent to one or more entities as discussed herein could be provided in any database, table, register, list, cache, storage, and/or storage structure: all of which can be referenced at any suitable timeframe. Any such storage options may also be included within the broad term 'memory element' as used herein.

Note that in certain example implementations, operations as set forth herein may be implemented by logic encoded in one or more tangible media that is capable of storing instructions and/or digital information and may be inclusive of non-transitory tangible media and/or non-transitory computer readable storage media (e.g., embedded logic provided in: an ASIC, digital signal processing (DSP) instructions, software [potentially inclusive of object code and source code], etc.) for execution by one or more processor(s), and/or other similar machine, etc. Generally, memory element(s) 604 and/or storage 606 can store data, software, code, instructions (e.g., processor instructions), logic, parameters, combinations thereof, and/or the like used for operations described herein. This includes memory element(s) 604 and/or storage 606 being able to store data, software, code, instructions (e.g., processor instructions), logic, parameters, combinations thereof, or the like that are executed to carry out operations in accordance with teachings of the present disclosure.

In some instances, software of the present embodiments may be available via a non-transitory computer useable medium (e.g., magnetic or optical mediums, magneto-optic mediums, CD-ROM, DVD, memory devices, etc.) of a stationary or portable program product apparatus, downloadable file(s), file wrapper(s), object(s), package(s), container(s), and/or the like. In some instances, non-transitory computer readable storage media may also be removable. For example, a removable hard drive may be used for memory/storage in some implementations. Other examples may include optical and magnetic disks, thumb drives, and smart cards that can be inserted and/or otherwise connected to a computing device for transfer onto another computer readable storage medium.

In summary, in some aspects, the techniques described herein relate to an apparatus including: a plurality of sub-rate receiver lanes each of which is configured to receive an analog receive signal from an analog front-end and produce digital sub-rate receiver data; one or more first digital-to-analog converters (DACs) shared across the plurality of sub-rate receiver lanes; one or more second DACs for each sub-rate receiver lane of the plurality of sub-rate receiver lanes, wherein the one or more second DACs of a respective sub-rate receiver lane are configured to provide output to be combined with an output of a corresponding one of the one or more first DACs during processing of the analog receive signal in a respective sub-rate receiver lane to account for a sub-rate receiver lane specific offset with respect to a corresponding one of the one or more first DACs; and a logic circuit configured to generate a first DAC control for each of the one or more first DACs and a second DAC control for each second DAC of each of the plurality of sub-rate receiver lanes.

In some aspects, a semiconductor area size of each respective second DAC is approximately 5-10 percent of a semiconductor area size of each first DAC.

In some aspects, each of the plurality of sub-rate receiver lanes includes an equalizer having a number of taps, and wherein a number of the one or more first DACs is equal to the number of taps of the equalizer, and a number of the one or more second DACs for each of the plurality of sub-rate receiver lanes is equal to the number of taps of the equalizer.

In some aspects, the logic circuit is configured to generate an average tap weight DAC control for each of the one or more first DACs and a mismatch tap cancellation DAC control for each second DAC in each of the plurality of sub-rate receiver lanes.

In some aspects, the logic circuit is configured to generate the mismatch tap cancellation DAC control for a respective tap of the equalizer of a corresponding sub-rate receiver lane of the plurality of sub-rate receiver lanes based on a difference from the average tap DAC control for the respective tap in the corresponding sub-rate receiver lane.

In some aspects, the logic circuit generates the average tap DAC control for each of the one or more first DACs based on an averaging of weights for a tap of the equalizer, across the plurality of sub-rate receiver lanes.

In some aspects, each of the one or more first DACs outputs an average tap weight current that is shared across the plurality of sub-rate receiver lanes, and each of the one or more second DAC, for a corresponding tap, outputs a mismatch tap weight current that is added to the average tap weight current, independently for each of the plurality of sub-rate receiver lanes.

In some aspects, outputs of the one or more first DACs and outputs of the one or more second DACs are combined and applied to equalizer or decision slicer circuits.

In some aspects, each of the plurality of sub-rate receiver lanes includes one or more decision slicer circuits configured to apply a corresponding slicer threshold of one or more slicer thresholds in generating the digital sub-rate receiver data, wherein a number of first DACs is equal to a number of the one or more slicer thresholds, and a number of the one or more second DACs for each of the plurality of sub-rate receiver lanes is equal to a number of the one or more slicer thresholds, wherein the logic circuit is further configured to generate an average slicer threshold control for each of the one or more first DACs and a mismatch slicer threshold control for each of the one or more second DACs in each of the plurality of sub-rate receiver lanes.

In some aspects, the logic circuit further generates the mismatch slicer threshold control for a respective second DAC of a corresponding sub-rate receiver lane of the plurality of sub-rate receiver lanes based on a difference from the average slicer threshold control for the respective second DAC in the corresponding sub-rate receiver lane.

In some aspects, each of the plurality of sub-rate receiver lanes includes: an equalizer having a number of taps and one or more decision slicer circuits configured to apply a corresponding slicer threshold of one or more slicer thresholds in generating the digital sub-rate receiver data; wherein the one or more first DACs include a number of average tap weight DACs equal to the number of taps, and a number of average slicer threshold DACs equal to a number of the one or more slicer thresholds; wherein the one or more second DACs include a number of mismatch tap cancellation DACs equal to the number of taps of the equalizer, and a number of mismatch slicer threshold DACs equal to the number of the one or more slicer thresholds for each of the plurality of sub-rate receiver lanes.

In some aspects, the logic circuit is configured to: generate an average tap weight DAC control for each of the one or more average tap weight DACs and a mismatch tap cancellation DAC control for each of the one or more mismatch tap cancellation DACs of each of the plurality of sub-rate receiver lanes; and generate an average slicer threshold control for each of the one or more slicer threshold DACs and a mismatch slicer threshold control for each of the one or more mismatch slicer threshold DACs in each of the plurality of sub-rate receiver lanes.

In some aspects, the techniques described herein relate to a method including: providing to a plurality of sub-rate receiver lanes, an analog receive signal; and in each of the plurality of sub-rate receiver lanes, processing the analog receive signal with one or more first digital-to-analog converters (DACs) shared across the plurality of sub-rate receiver lanes and with one or more second DACs for each sub-rate receiver lane of the plurality of sub-rate receiver lanes, wherein the one or more second DACs of a respective sub-rate receiver lane are configured to provide output to be combined with an output of a corresponding one of the one or more first DACs to account for a sub-rate receiver lane specific offset with respect to a corresponding one of the one or more first DACs.

In some aspects, the method further includes: generating an average DAC control for each of the one or more first DACs and a mismatch tap cancellation DAC control for each second DAC of each of the plurality of sub-rate receiver lanes.

In some aspects, generating includes generating the mismatch tap cancellation DAC control for a respective tap of an equalizer of a corresponding sub-rate receiver lane of the plurality of sub-rate receiver lanes based on a difference from the average tap DAC control for the respective tap in the corresponding sub-rate receiver lane.

In some aspects, generating includes generating the average tap DAC control for each of the one or more first DACs based on an averaging of weights for a tap of the equalizer, across the plurality of sub-rate receiver lanes.

In some aspects, the techniques described herein relate to an apparatus including: a plurality of sub-rate receiver lanes each of which is configured to receive an analog receive signal from an analog front-end and produce digital sub-rate receiver data, wherein each of the plurality of sub-rate receiver lanes includes an equalizer having a number of taps; one or more first digital-to-analog converters (DACs) shared across the plurality of sub-rate receiver lanes; one or more second DACs for each sub-rate receiver lane of the plurality of sub-rate receiver lanes, wherein the one or more second DACs of a respective sub-rate receiver lane are configured to provide output to be combined with an output of a corresponding one of the one or more first DACs during processing of the analog receive signal in the respective sub-rate receiver lane to account for a sub-rate receiver lane specific offset with respect to a corresponding one of the one or more first DACs; and a logic circuit configured to generate an average tap weight DAC control for each of the one or more first DACs and a mismatch tap cancellation DAC control for each second DAC in each of the plurality of sub-rate receiver lanes.

In some aspects, a number of the one or more first DACs is equal to the number of taps of the equalizer, and a number of the one or more second DACs for each of the plurality of sub-rate receiver lanes is equal to the number of taps of the equalizer.

In some aspects, each of the plurality of sub-rate receiver lanes includes one or more decision slicer circuits configured to apply a corresponding slicer threshold of one or more slicer thresholds in generating the digital sub-rate receiver data, wherein a number of first DACs is equal to a number of the one or more slicer thresholds, and a number of the one or more second DACs for each of the plurality of sub-rate receiver lanes is equal to a number of the one or more slicer thresholds, wherein the logic circuit is further configured to generate an average slicer threshold control for each of the one or more first DACs and a mismatch slicer threshold control for each of the one or more second DACs in each of the plurality of sub-rate receiver lanes.

In some aspects, the logic circuit further generates the mismatch slicer threshold control for a respective second DAC of a corresponding sub-rate receiver lane of the plurality of sub-rate receiver lanes based on a difference from the average slicer threshold control for the respective second DAC in the corresponding sub-rate receiver lane.

Variations and Implementations

Embodiments described herein may include one or more networks, which can represent a series of points and/or network elements of interconnected communication paths for receiving and/or transmitting messages (e.g., packets of information) that propagate through the one or more networks. These network elements offer communicative interfaces that facilitate communications between the network elements. A network can include any number of hardware and/or software elements coupled to (and in communication with) each other through a communication medium. Such networks can include, but are not limited to, any local area network (LAN), virtual LAN (VLAN), wide area network (WAN) (e.g., the Internet), software defined WAN (SD-WAN), wireless local area (WLA) access network, wireless wide area (WWA) access network, metropolitan area network (MAN), Intranet, Extranet, virtual private network (VPN), Low Power Network (LPN), Low Power Wide Area Network (LPWAN), Machine to Machine (M2M) network, Internet of Things (IoT) network, Ethernet network/switching system, any other appropriate architecture and/or system that facilitates communications in a network environment, and/or any suitable combination thereof.

Networks through which communications propagate can use any suitable technologies for communications including wireless communications (e.g., 4G/5G/nG, IEEE 802.11 (e.g., Wi-Fi®/Wi-Fi6®), IEEE 802.16 (e.g., Worldwide Interoperability for Microwave Access (WiMAX)), Radio-Frequency Identification (RFID), Near Field Communication (NFC), Bluetooth™ mm.wave, Ultra-Wideband (UWB), etc.), and/or wired communications (e.g., T1 lines, T3 lines, digital subscriber lines (DSL), Ethernet, Fibre Channel, etc.). Generally, any suitable means of communications may be used such as electric, sound, light, infrared, and/or radio to facilitate communications through one or more networks in accordance with embodiments herein. Communications, interactions, operations, etc. as discussed for various embodiments described herein may be performed among entities that may directly or indirectly connected utilizing any algorithms, communication protocols, interfaces, etc. (proprietary and/or non-proprietary) that allow for the exchange of data and/or information.

Communications in a network environment can be referred to herein as 'messages', 'messaging', 'signaling', 'data', 'content', 'objects', 'requests', 'queries', 'responses', 'replies', etc. which may be inclusive of packets. As referred to herein and in the claims, the term 'packet' may be used in a generic sense to include packets, frames, segments, datagrams, and/or any other generic units that may be used to transmit communications in a network environment. Generally, a packet is a formatted unit of data that can contain control or routing information (e.g., source and destination address, source and destination port, etc.) and data, which is also sometimes referred to as a 'payload', 'data payload', and variations thereof. In some embodiments, control or routing information, management information, or the like can be included in packet fields, such as within header(s) and/or trailer(s) of packets. Internet Protocol (IP) addresses discussed herein and in the claims can include any IP version 4 (IPv4) and/or IP version 6 (IPv6) addresses.

To the extent that embodiments presented herein relate to the storage of data, the embodiments may employ any number of any conventional or other databases, data stores or storage structures (e.g., files, databases, data structures, data or other repositories, etc.) to store information.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of can be represented using the'(s)' nomenclature (e.g., one or more element(s)).

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. An apparatus comprising:
a plurality of sub-rate receiver lanes each of which is configured to receive an analog receive signal from an analog front-end and produce digital sub-rate receiver data;
one or more first digital-to-analog converters (DACs) shared across the plurality of sub-rate receiver lanes;
one or more second DACs for each sub-rate receiver lane of the plurality of sub-rate receiver lanes, wherein the one or more second DACs of a respective sub-rate receiver lane are configured to provide output to be combined with an output of a corresponding one of the one or more first DACs during processing of the analog receive signal in the respective sub-rate receiver lane to account for a sub-rate receiver lane specific offset with respect to a corresponding one of the one or more first DACs; and
a logic circuit configured to generate a first DAC control for each of the one or more first DACs and a second DAC control for each second DAC of each of the plurality of sub-rate receiver lanes.

2. The apparatus of claim 1, wherein a semiconductor area size of each respective second DAC is approximately 5-10 percent of a semiconductor area size of each first DAC.

3. The apparatus of claim 1, wherein each of the plurality of sub-rate receiver lanes includes an equalizer having a number of taps, and wherein a number of the one or more first DACs is equal to the number of taps of any equalizer of the plurality of sub-rate receiver lanes, and a number of the one or more second DACs for each of the plurality of sub-rate receiver lanes is equal to the number of taps of said any equalizer of the plurality of sub-rate receiver lanes.

4. The apparatus of claim 3, wherein the logic circuit is configured to generate an average tap weight DAC control for each of the one or more first DACs and a mismatch tap cancellation DAC control for each second DAC in each of the plurality of sub-rate receiver lanes.

5. The apparatus of claim 4, wherein the logic circuit is configured to generate the mismatch tap cancellation DAC control for a respective tap of the equalizer of a corresponding sub-rate receiver lane of the plurality of sub-rate receiver lanes based on a difference from the average tap weight DAC control for the respective tap in the corresponding sub-rate receiver lane.

6. The apparatus of claim 5, wherein the logic circuit generates the average tap weight DAC control for each of the one or more first DACs based on an averaging of weights for a tap of the equalizer, across the plurality of sub-rate receiver lanes.

7. The apparatus of claim 3, wherein each of the one or more first DACs outputs an average tap weight current that is shared across the plurality of sub-rate receiver lanes, and each of the one or more second DACs, for a corresponding tap, outputs a mismatch tap weight current that is added to the average tap weight current, independently for each of the plurality of sub-rate receiver lanes.

8. The apparatus of claim 7, wherein outputs of the one or more first DACs and outputs of the one or more second DACs are combined and applied to the equalizer in a corresponding sub-rate receiver lane of the plurality of sub-rate receiver lanes.

9. The apparatus of claim 1, wherein each of the plurality of sub-rate receiver lanes includes one or more decision slicer circuits configured to apply a corresponding slicer threshold of one or more slicer thresholds in generating the digital sub-rate receiver data, wherein a number of first DACs is equal to a number of the one or more slicer thresholds, and a number of the one or more second DACs for each of the plurality of sub-rate receiver lanes is equal to the number of the one or more slicer thresholds, wherein the logic circuit is further configured to generate an average slicer threshold control for each of the one or more first DACs and a mismatch slicer threshold control for each of the one or more second DACs in each of the plurality of sub-rate receiver lanes.

10. The apparatus of claim 9, wherein the logic circuit further generates the mismatch slicer threshold control for a respective second DAC of a corresponding sub-rate receiver lane of the plurality of sub-rate receiver lanes based on a difference from the average slicer threshold control for the respective second DAC in the corresponding sub-rate receiver lane.

11. The apparatus of claim 1, wherein each of the plurality of sub-rate receiver lanes includes:
an equalizer having a number of taps and one or more decision slicer circuits configured to apply a corresponding slicer threshold of one or more slicer thresholds in generating the digital sub-rate receiver data;
wherein the one or more first DACs include a number of average tap weight DACs equal to the number of taps, and a number of average slicer threshold DACs equal to a number of the one or more slicer thresholds;
wherein the one or more second DACs include a number of mismatch tap cancellation DACs equal to the number of taps of any equalizer of the plurality of sub-rate receiver lanes, and a number of mismatch slicer threshold DACs equal to the number of the one or more slicer thresholds for each of the plurality of sub-rate receiver lanes.

12. The apparatus of claim 11, wherein the logic circuit is configured to:
generate an average tap weight DAC control for each of the average tap weight DACs and a mismatch tap cancellation DAC control for each of the mismatch tap cancellation DACs of each of the plurality of sub-rate receiver lanes; and
generate an average slicer threshold control for each of the mismatch slicer threshold DACs and a mismatch slicer threshold control for each of the mismatch slicer threshold DACs in each of the plurality of sub-rate receiver lanes.

13. A method comprising:
providing to a plurality of sub-rate receiver lanes, an analog receive signal;
providing one or more first digital-to-analog converters (DACs) shared across the plurality of sub-rate receiver lanes;
providing one or more second DACs for each sub-rate receiver lane of the plurality of sub-rate receiver lanes; and
in each of the plurality of sub-rate receiver lanes, processing the analog receive signal, wherein the one or more second DACs of a respective sub-rate receiver lane are configured to provide output to be combined with an output of a corresponding one of the one or more first DACs to account for a sub-rate receiver lane specific offset with respect to a corresponding one of the one or more first DACs.

14. The method of claim 13, further comprising:
generating an average tap DAC control for each of the one or more first DACs and a mismatch tap cancellation DAC control for each second DAC of each of the plurality of sub-rate receiver lanes.

15. The method of claim 14, wherein generating comprises generating the mismatch tap cancellation DAC control for a respective tap of an equalizer of a corresponding sub-rate receiver lane of the plurality of sub-rate receiver lanes based on a difference from the average tap DAC control for the respective tap in the corresponding sub-rate receiver lane.

16. The method of claim 15, wherein generating comprises generating the average tap DAC control for each of the one or more first DACs based on an averaging of weights for a tap of the equalizer of a respective sub-rate receiver lane, across the plurality of sub-rate receiver lanes.

17. An apparatus comprising:
a plurality of sub-rate receiver lanes each of which is configured to receive an analog receive signal from an analog front-end and produce digital sub-rate receiver data, wherein each of the plurality of sub-rate receiver lanes includes an equalizer having a number of taps;
one or more first digital-to-analog converters (DACs) shared across the plurality of sub-rate receiver lanes;
one or more second DACs for each sub-rate receiver lane of the plurality of sub-rate receiver lanes, wherein the one or more second DACs of a respective sub-rate receiver lane are configured to provide output to be combined with an output of a corresponding one of the one or more first DACs during processing of the analog receive signal in the respective sub-rate receiver lane to account for a sub-rate receiver lane specific offset with respect to a corresponding one of the one or more first DACs; and
a logic circuit configured to generate an average tap weight DAC control for each of the one or more first DACs and a mismatch tap cancellation DAC control for each second DAC in each of the plurality of sub-rate receiver lanes.

18. The apparatus of claim 17, wherein a number of the one or more first DACs is equal to the number of taps of any equalizer of the plurality of sub-rate receiver lanes, and a number of the one or more second DACs for each of the plurality of sub-rate receiver lanes is equal to the number of taps of said any equalizer of the plurality of sub-rate receiver lanes.

19. The apparatus of claim 17, wherein each of the plurality of sub-rate receiver lanes includes one or more decision slicer circuits configured to apply a corresponding slicer threshold of one or more slicer thresholds in generating the digital sub-rate receiver data, wherein a number of first DACs is equal to a number of the one or more slicer thresholds, and a number of the one or more second DACs for each of the plurality of sub-rate receiver lanes is equal to the number of the one or more slicer thresholds, wherein the logic circuit is further configured to generate an average slicer threshold control for each of the one or more first DACs and a mismatch slicer threshold control for each of the one or more second DACs in each of the plurality of sub-rate receiver lanes.

20. The apparatus of claim 19, the logic circuit further generates the mismatch slicer threshold control for a respective second DAC of a corresponding sub-rate receiver lane of the plurality of sub-rate receiver lanes based on a difference from the average slicer threshold control for the respective second DAC in the corresponding sub-rate receiver lane.

* * * * *